(12) United States Patent
El-Kareh et al.

(10) Patent No.: US 8,450,179 B2
(45) Date of Patent: May 28, 2013

(54) SEMICONDUCTOR DEVICE HAVING A FIRST BIPOLAR DEVICE AND A SECOND BIPOLAR DEVICE AND METHOD FOR FABRICATION

(75) Inventors: Badih El-Kareh, Cedar Park, TX (US); Hiroshi Yasuda, Plano, TX (US); Scott Balster, Dallas, TX (US)

(73) Assignee: Texas Instruments Deutschland GmbH, Freising (DE)

( * ) Notice: Subject to any disclaimer, the term of this patent is extended or adjusted under 35 U.S.C. 154(b) by 471 days.

(21) Appl. No.: 11/670,729

(22) Filed: Feb. 2, 2007

(65) Prior Publication Data

US 2007/0207585 A1    Sep. 6, 2007

Related U.S. Application Data

(60) Provisional application No. 60/882,383, filed on Dec. 28, 2006.

(30) Foreign Application Priority Data

Feb. 2, 2006 (DE) .......................... 10 2006 004 796

(51) Int. Cl.
*H01L 21/331* (2006.01)
(52) U.S. Cl.
USPC ............ 438/338; 257/E21.371; 257/E21.608; 257/E21.696; 257/E27.056; 257/E29.193
(58) Field of Classification Search
USPC .................. 438/309–378; 257/197, 205, 474, 257/477, 517, 526, 539, 565–593
See application file for complete search history.

(56) References Cited

U.S. PATENT DOCUMENTS

| | | | | |
|---|---|---|---|---|
| 5,580,815 | A * | 12/1996 | Hsu et al. ...................... | 438/362 |
| 5,856,695 | A * | 1/1999 | Ito et al. ......................... | 257/370 |
| 6,472,288 | B2 * | 10/2002 | Freeman et al. ............. | 438/369 |
| 6,531,369 | B1 * | 3/2003 | Ozkan et al. .................. | 438/312 |
| 6,936,910 | B2 * | 8/2005 | Ellis-Monaghan et al. .. | 257/552 |
| 2004/0110353 | A1 * | 6/2004 | Mallikarjunaswamy ..... | 438/309 |

OTHER PUBLICATIONS

Marco Racanelli and Paul Kempf: "SiGe BiCMOS Technology for Communication Products," IEEE 2003 Custom Integrated Circuits Conference, pp. 331-334.

* cited by examiner

*Primary Examiner* — David Vu
*Assistant Examiner* — Jonathan Han
(74) *Attorney, Agent, or Firm* — Alan A. R. Cooper; Wade J. Brady, III; Frederick J. Telecky, Jr.

(57) ABSTRACT

A method for fabricating a semiconductor device having a first and second bipolar devices of the same dopant type includes: depositing a dielectric layer over a semiconductor layer, depositing a gate conductor layer over the dielectric layer, defining base regions of both bipolar devices, removing the gate conductor layer and dielectric layer in the base regions, depositing a base layer on the gate conductor layer and on the exposed semiconductor layer in the base regions, depositing an insulating layer over the base layer, forming a photoresist layer and defining emitter regions of both bipolar devices, removing the photoresist layer in the emitter regions thereby forming two emitter windows, masking the emitter window of the first bipolar device and exposing the base layer in the base region of the second bipolar device to an additional emitter implant through the associated emitter window.

19 Claims, 5 Drawing Sheets

SEMICONDUCTOR DEVICE HAVING A FIRST BIPOLAR DEVICE AND A SECOND BIPOLAR DEVICE AND METHOD FOR FABRICATION

CROSS-REFERENCE TO RELATED APPLICATIONS

This application claims priority of German Patent Application Serial No. 10 2006 004 796.6, filed Feb. 2, 2006 and the benefit of U.S. Provisional Application Ser. No. 60/882,383, filed Dec. 28, 2006.

TECHNICAL FIELD

The present invention relates to a method for fabricating a semiconductor device comprising a first bipolar device and a second bipolar device being of the same dopant type. The present invention further relates to a semiconductor device comprising a first bipolar device and a second bipolar device being of the same dopant type.

In noise-sensitive high-performance analog applications, bipolar transistors with a gain of near 1000 are typically required to reduce the base current, and hence noise, at a specific collector current. Stand-alone, monolithic bipolar transistors with a gain of near 1000 are known from prior art. The complexity of integrating such a super-beta bipolar transistor in a conventional BiCMOS process flow is prohibitive and it would excessively increase the production costs.

SUMMARY OF THE INVENTION

The invention provides a method for integrating a super-beta bipolar transistor in an existing BiCMOS process flow with minimal added complexity.

According to a first embodiment, the method comprises the steps of depositing a dielectric layer over a semiconductor layer, depositing a gate conductor layer over the dielectric layer, defining base regions of the first and second bipolar devices, removing the gate conductor layer and the dielectric layer in the base regions of the first and second bipolar devices, depositing a base layer on the gate conductor layer and on the exposed semiconductor layer in the base regions of the first and second bipolar devices, depositing an insulating layer over said base layer, forming a photoresist layer and defining emitter regions of the first and second bipolar devices, removing the photoresist layer in the emitter regions of the first and second bipolar devices thereby forming two emitter windows, masking the emitter window of the first bipolar device and exposing the base layer in the base region of the second bipolar device to an additional emitter implant through the associated emitter window. Since base patterning and base deposition of the first and second bipolar devices is made in the same process step, the method according to the present invention only requires one additional masking step for selectively implanting the base region of the second bipolar transistor through the associated emitter window. The additional implant has the effect to shift the emitter-base junction deeper into the SiGe region so that the Ge concentration is increased at the emitter-base junction compared to the Ge concentration at the emitter-base junction without additional implant. The concentration of Ge at the emitter-base junction is decisive to the gain of the bipolar transistor. Increasing the Ge concentration at the junction by means of the additional implant leads to a bipolar transistor with increased gain. Further, the additional implant has the effect that the base dopant near its peak concentration is compensated by the implanted dopant thereby reducing the Gummel number which is approximately equal to the number of majority charge carriers per unit area in the base. A reduced Gummel number likewise leads to an increased gain. Bipolar transistors with a minimum gain of 1000 can be achieved in this manner.

According to a second embodiment, the method comprises the steps of depositing a dielectric layer over a semiconductor layer, depositing a gate conductor layer over the dielectric layer, defining a base region of the first bipolar device, removing the gate conductor layer and the dielectric layer in the base region of the first bipolar device, depositing a base layer on the gate conductor layer and on the semiconductor layer in the base region of the first bipolar device, defining a base region of the second bipolar device, removing the base layer, the gate conductor layer and the dielectric layer in the base region of the second bipolar device, depositing a base layer in the base region of the second bipolar device, wherein the base layers of the first and second bipolar devices are in-situ doped during deposition so as to have different dopant profiles. Since the base layers of the first and second bipolar devices are deposited separately, the dopant profiles of the two bipolar devices can be formed independently from each other. In this variant integrating a super-beta bipolar transistor in a BiCMOS process flow requires a separate base patterning and deposition, and an additional selectively implanted collector (SIC).

In one embodiment the base layers are silicon-germanium layers. For obtaining a bipolar device with increased gain, the base layer of the second bipolar transistor is in-situ doped so as to have a higher germanium concentration at the emitter-base junction than the base layer of the first bipolar transistor has at its emitter-base junction.

The invention further provides a semiconductor device comprising a medium-gain bipolar transistor and a super-beta bipolar transistor thus being adequate for noise-sensitive high-performance analog applications.

The semiconductor device according to one embodiment of the invention comprises a first bipolar device and a second bipolar device being of the same dopant type. The first bipolar device has a base layer with a first dopant profile and the second bipolar device has a base layer with a second dopant profile, wherein the first and second dopant profiles are different from each other. Due to the different dopant profiles of the base layers the first bipolar device has a gain different from the gain of the second bipolar device.

BRIEF DESCRIPTION OF THE DRAWINGS

Further features and advantages of the invention will appear from the following description with reference to the drawings in which.

DETAILED DESCRIPTION OF EMBODIMENTS

Figure 1:
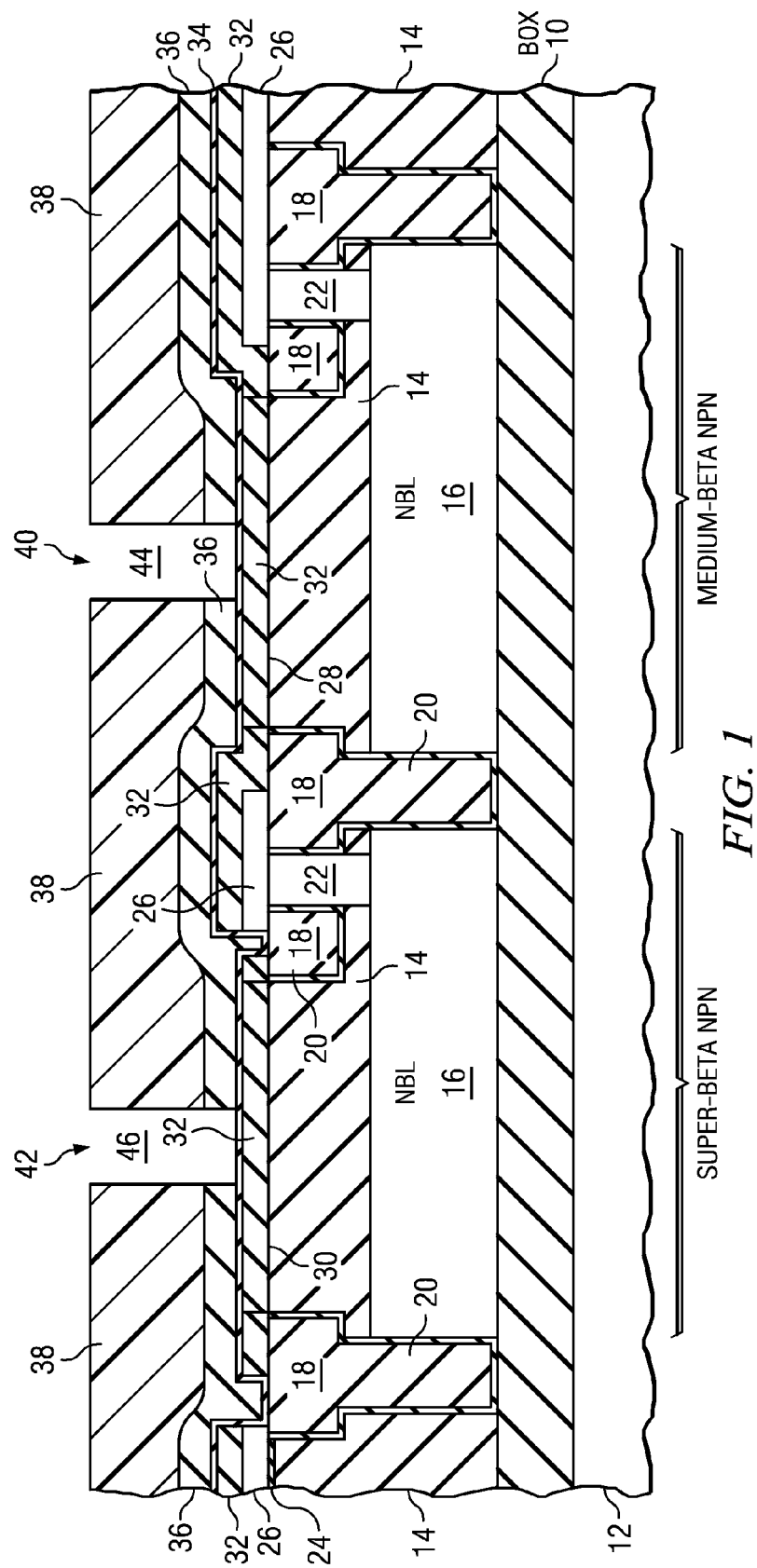
FIG. 1 schematically shows a part of a semiconductor device which is provided for building a medium-beta bipolar transistor and a super-beta bipolar transistor according to a first embodiment.

FIG. 1 shows a part of the semiconductor device which is intended for building a super-beta bipolar transistor adjacent to a medium-beta bipolar transistor. The super-beta bipolar transistor and the medium-beta bipolar transistor are of the same dopant type, for example, NPN transistors. The device comprises a buried oxide layer (BOX) 10 that separates a support wafer 12 from a top single-crystal semiconductor layer 14 which is typically a silicon layer. The semiconductor layer 14 comprises electrically active regions 16 for the medium-beta bipolar transistor and the super-beta bipolar transistor and electrically inactive regions 18 for isolating the electrically active regions 16 from each other. The electrically inactive regions 18 may be formed by trenches 20 etched in the semiconductor layer 14 which are filled with an isolating material such as oxide. The electrically active regions 16 comprise an N doped buried layer (NBL) for each bipolar transistor. Preferably, N doped sinkers 22 are formed in the electrically active regions 16 of the bipolar devices. The sinkers 22 serve to reduce series resistance in the bipolar devices. Methods for forming the above-described structure are well-known from prior art and shall not be described here.

A thin dielectric layer 24, which is typically an oxide layer, is grown on the semiconductor layer 14. The dielectric layer 24 forms the gate oxide of the MOS transistors of the BiCMOS device which are not seen in FIG. 1. In modern CMOS processes, the thickness of the gate oxide ranges from 2 to 12 nm. A doped or undoped gate conductor layer 26, which is typically a polysilicon layer, is deposited over the dielectric layer 24. After that, the base region 28 of the medium-beta bipolar transistor and the base region 30 of the super-beta bipolar transistor are defined simultaneously in the same process steps by well-known patterning techniques which comprise, for example, applying a photoresist layer (not shown here) on the gate conductor layer 26, exposing selected regions of the photoresist layer, developing the photoresist, etching the regions of the gate conductor layer 26 which are no longer covered by the photoresist and removing the remaining photoresist. The gate conductor layer 26 may be etched by RIE (Reactive Ion Etching). After that, the uncovered portions of the dielectric layer 24 in the base region 28 of the medium-beta bipolar transistor and in the base region 30 of the super-beta bipolar transistor are etched in the same process step and a base layer 32 is deposited. In one embodiment, the base layer 32 is a silicon-germanium layer. During deposition, the base layer 32 is in-situ doped. Since both transistors are NPN type, a typical dopant is boron. The silicon-germanium layer 32 grows epitaxially in the base regions 28, 30 of the bipolar transistors over the exposed single-crystal semiconductor layer 14 and as polycrystalline silicon over the exposed electrically inactive regions 18 and over the polysilicon layer 26. An interface oxide layer 34 is formed over the base layer 32. The presence of an interface oxide layer 34 reduces the base current and increases the transistor gain. Thus, in the method of the present invention, the base of the medium-beta bipolar transistor and the base of the super-beta bipolar transistor are simultaneously defined and are simultaneously deposited so that forming of the base of the super-beta bipolar device does not require any additional masking or process steps until that point in the process flow.

An insulating layer 36 is formed over the interface oxide layer 34, and a photoresist layer 38 is formed over the insulating layer 36. The insulating layer 36 may be formed by a stack of nitride and oxide. The emitter region 40 of the medium-beta bipolar transistor and the emitter region 42 of the super-beta bipolar transistor are defined, and the photoresist layer 38 and the insulating layer 36 are removed in these emitter regions 40, 42 so that an emitter window 44 for the medium-beta bipolar transistor and an emitter window 46 for the super-beta bipolar transistor are formed. Again, defining the emitter regions 40, 42 and forming the emitter windows 44, 46 for the medium-beta bipolar transistor and the super-beta bipolar transistor is done in the same process steps and therefore integrating the super-beta bipolar transistor into a BiCMOS process does not require any additional masking or process steps until that point of the process flow as compared with the process flow of a BiCMOS device without a super-beta bipolar transistor.

Figure 2:
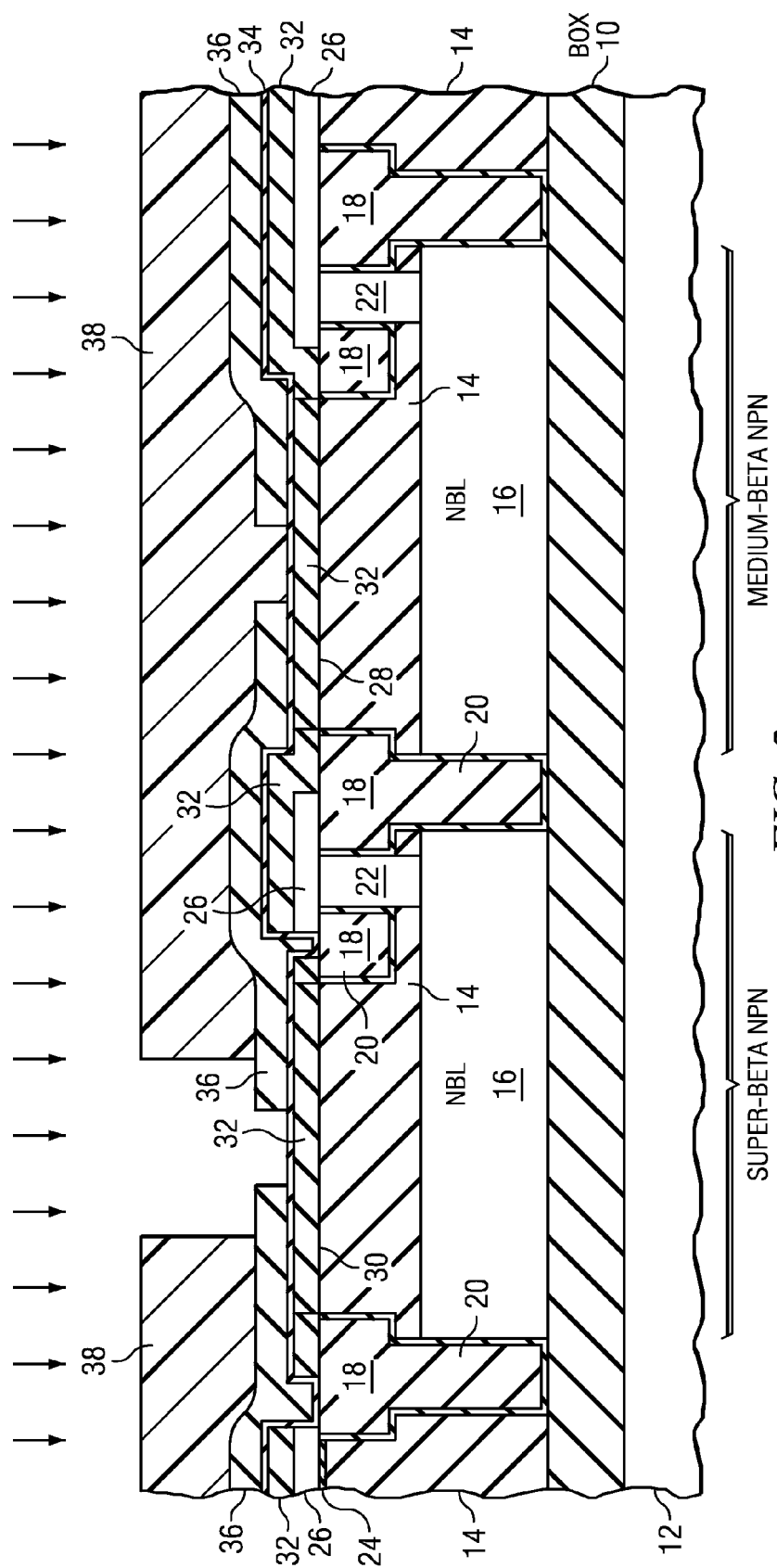
FIG. 2 schematically shows the part of the device of FIG. 1 after masking one of the two emitter windows for selectively exposing the base of the super-beta bipolar transistor to an additional emitter implant through the other of the two emitter windows.

FIG. 2 shows the next steps for integrating the super-beta bipolar transistor into the present process flow. The emitter window 44 of the medium-beta bipolar transistor is masked by a photoresist so that only the base region 30 of the super-beta bipolar transistor is exposed in the subsequent implantation step. In the subsequent implantation step, a dopant is selectively implanted into the base region 30 of the super-beta bipolar transistor through the associated emitter window 46 at an energy and dose that shifts the emitter-base junction deeper into the SiGe region so that the Ge concentration is increased at the emitter-base junction as compared with the Ge concentration at the emitter-base junction without additional implant. In the case of an NPN transistor the additional dopant typically is arsenic or phosphorus.

After the additional implant, the emitter window 44 of the medium-beta transistor is again opened and an emitter is formed in the same way as in a standard BiCMOS process. Since the base region 30 of the super-beta bipolar transistor is exposed through the emitter window, the emitters of both transistors are formed simultaneously. The emitter is typically formed by depositing an epitaxial polysilicon layer. The polysilicon layer may be in-situ doped during deposition, as, for example, in the case on an NPN transistor typically with arsenic or phosphorus.

Figure 3:
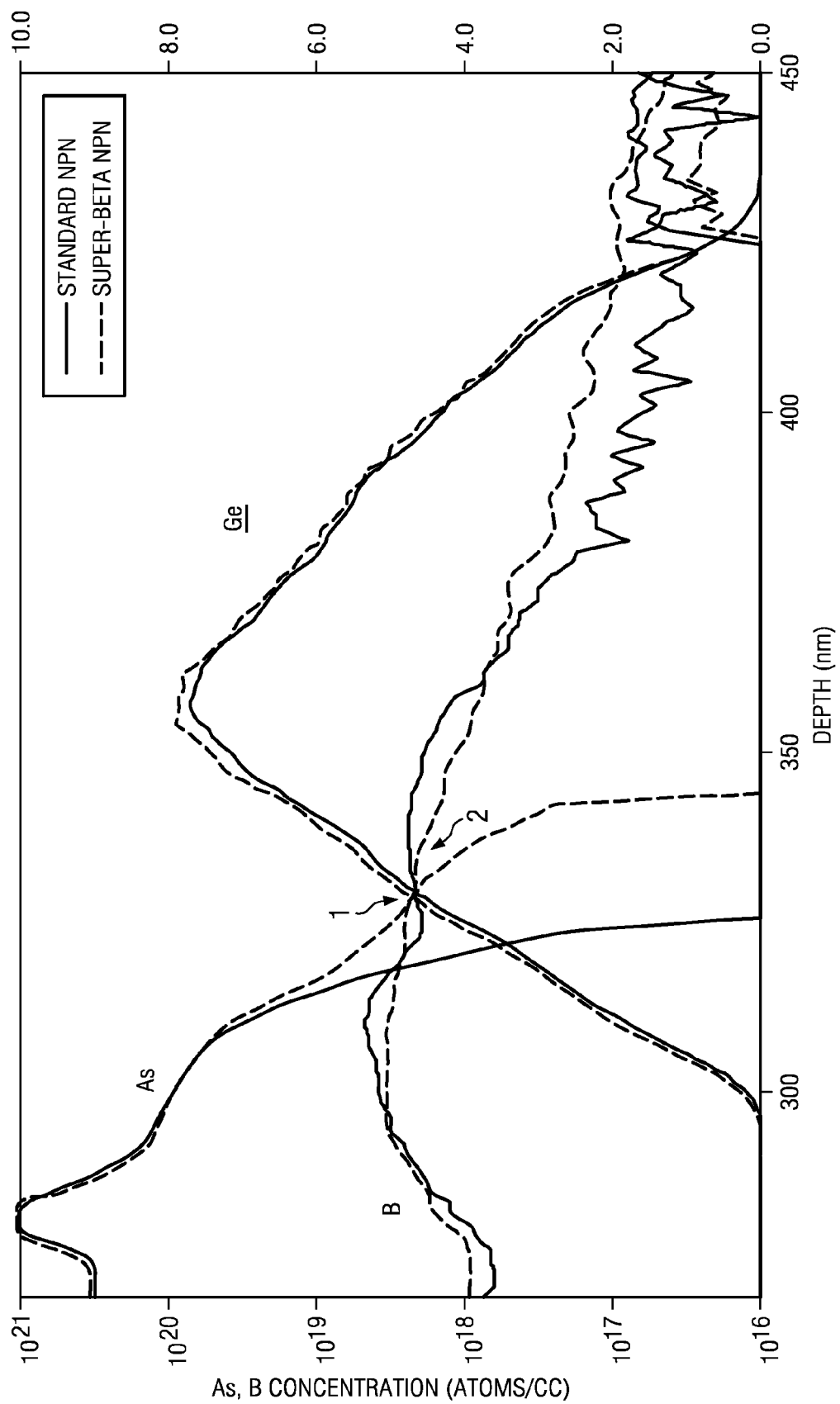
FIG. 3 shows the dopant concentration in dependence on the depth of the bipolar transistor of a medium bipolar transistor compared with that of a super-beta bipolar transistor.

FIG. 3 shows the dopant profiles of a medium-beta NPN transistor as compared with those of a super-beta NPN transistor. The dopant profiles are obtained by SIMS (Secondary Ion Mass Spectroscopy). The dopants are boron (B), arsenic (As) and germanium (Ge). The profiles are the profiles of the finished device, after high-temperature process steps and annealing cycles. As can be seen, due to the additional implant with As, the As profile intersects the Ge profile at a higher Ge concentration value as compared with the Ge concentration value without additional implant. The depth at which these two profiles intersect approximately corresponds to the depth where the emitter/base junction is located so that, due to the additional implant, the Ge concentration at the emitter/base junction is increased. The point of intersection between the As and Ge profiles with additional As implantation is marked with the number 1 in FIG. 3. Since the concentration of Ge at the emitter-base junction is essential to the gain of the bipolar transistor, the additional implant leads to a bipolar transistor with a higher gain. As is marked with the number 2 in FIG. 3, the additional implant with As has the further effect that the base dopant B near its peak concentration is compensated by the implanted As, thereby reducing the Gummel number which is approximately equal to the number of majority charge carriers per unit area in the base. A reduced Gummel number likewise leads to an increased gain.

Super-beta transistors with a minimum gain of 1000 can be produced in this manner. The medium-gain bipolar transistor typically has a gain between 150 and 300. Regarding the profile of B, it is noted in FIG. 3 that the tail at the base-collector junction has an increased concentration. This is due to interstitial silicon introduced in the base layer with the additional emitter implant, since the interstitial silicon enhances diffusion of boron.

Figure 4:
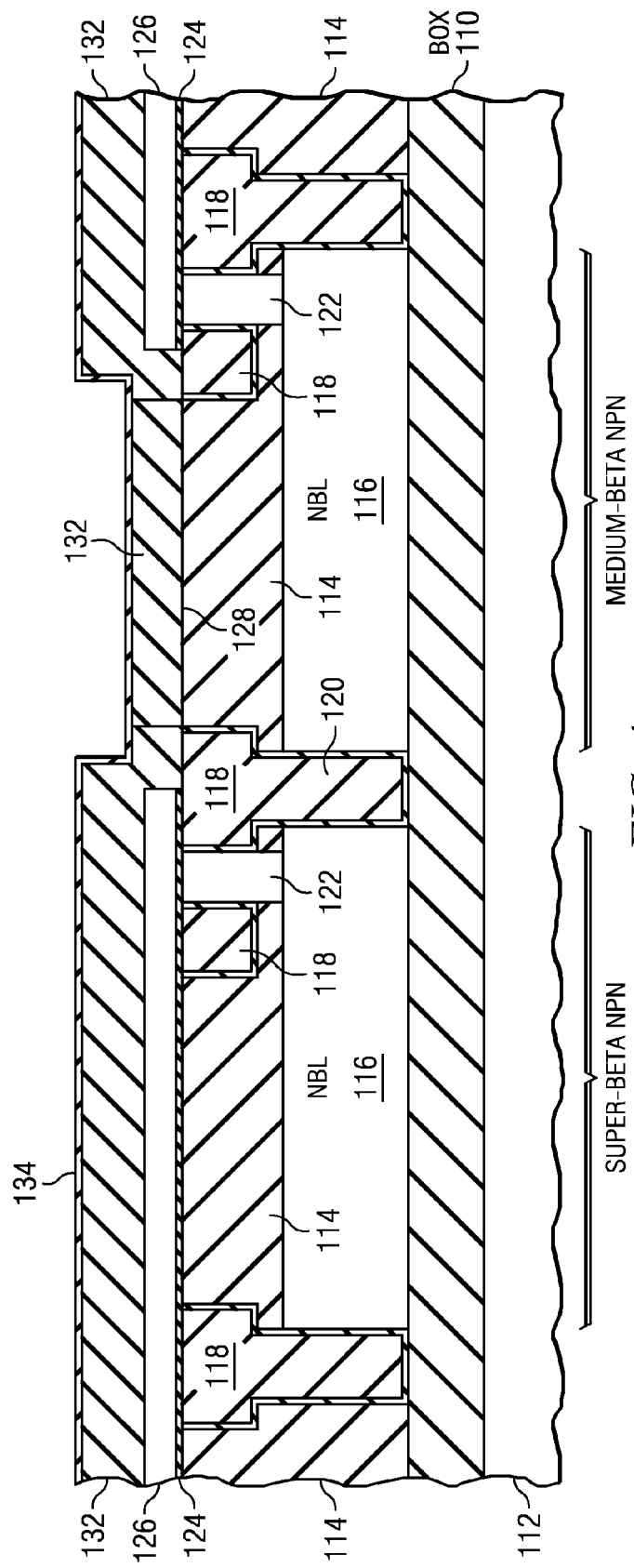
FIGS. 4 and 5 schematically show a part of a semiconductor device which is provided for building a medium-beta bipolar transistor and a super-beta bipolar transistor according to a second variant of the method according to the present invention.
Figure 5:
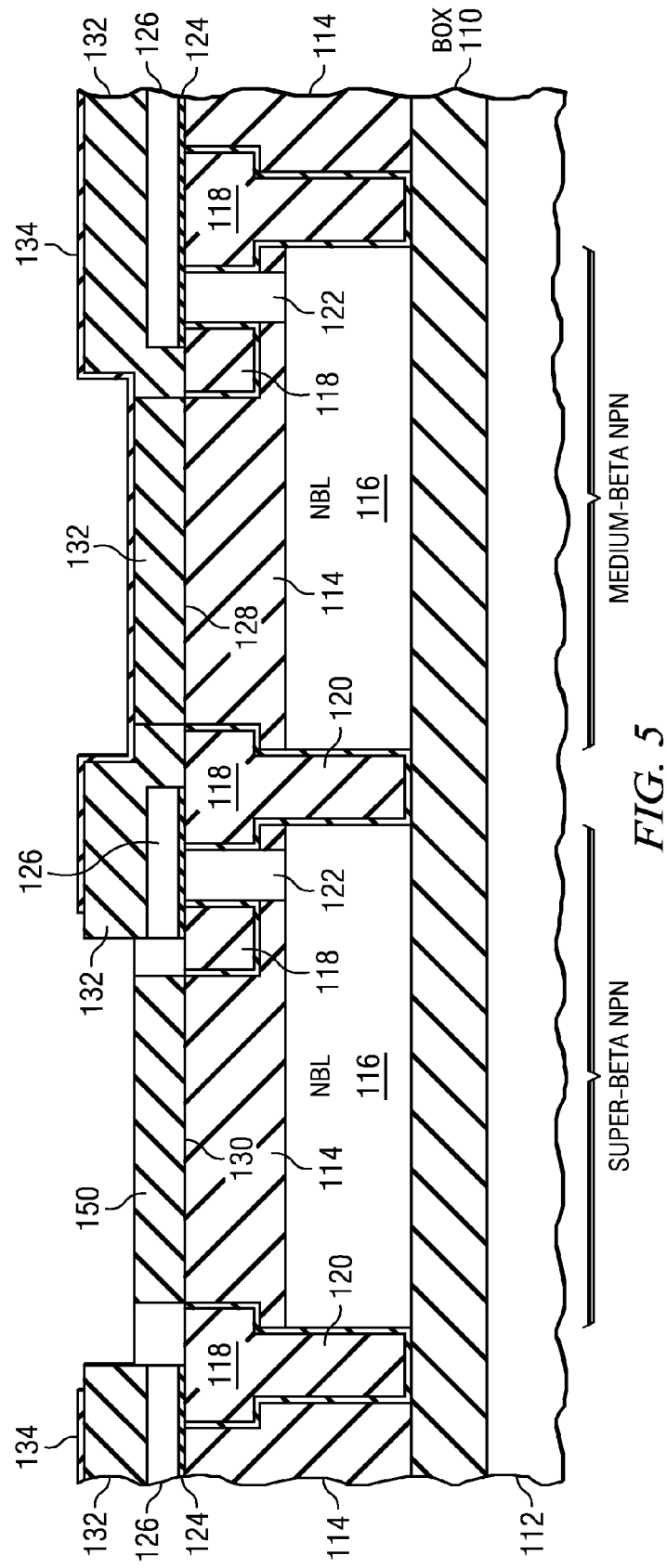

FIGS. 4 and 5 schematically show a second embodiment for integrating a super-beta bipolar device into a standard BiCMOS device. According to this variant base patterning and deposition of the medium-beta bipolar transistor and of the super-beta bipolar transistor are made one after the other. As in the method according to the first variant, a thin dielectric layer 124, which is typically an oxide layer and which forms the gate oxide of the MOS transistors, is grown on the semiconductor layer 114. A gate conductor layer 126, which is typically a polysilicon layer, is deposited over the thin dielectric layer 124. After that, as distinct from the first variant, only the base region 128 of the medium-beta bipolar transistor is defined and only the gate conductor layer 126 and the thin dielectric layer 124 in the defined base region 128 of the medium-beta bipolar device are removed. A base layer 132 is then deposited in the base region 128 of the medium-beta bipolar transistor and on the gate conductor layer 126. The base layer 132 may be a silicon-germanium layer and is in-situ doped during deposition. The silicon-germanium layer grows epitaxially in the base region 128 of the medium-beta bipolar transistor over the exposed single-crystal semiconductor layer 114 (highlighted with horizontal lines) and as polycrystalline silicon over the exposed electrically inactive regions 118 and over the gate conductor layer 126 (highlighted with diagonal lines).

Only after forming the base layer 132 of the medium-beta bipolar transistor, the base region 130 of the super-beta bipolar transistor is defined by, for example, applying a photoresist layer on the base layer 132, exposing selected regions of the photoresist layer, developing the photoresist, etching the regions of the base layer 132 that are no longer covered by the photoresist and removing of the remaining photoresist. After that, the uncovered gate conductor layer 126 and the thin dielectric layer 124 in the base region 130 of the super-beta bipolar transistor are etched and a base layer 150 for the super-beta bipolar transistor is deposited. Since the base layer 150 of the super-beta bipolar transistor is deposited separately from the base layer 132 of the medium-beta bipolar transistor, the dopant profile of the super-beta bipolar transistor can be formed independently of the dopant profile of the medium-beta bipolar transistor. After the base deposition, a Selectively Implanted Collector (SIC) is positioned beneath the intrinsic base of the super-beta bipolar transistor, e.g., by implanting through the base epitaxial layer while being masked by the emitter window. the base of the super-beta bipolar device does not require any additional masking or process steps until that point of the process flow.

In one embodiment, the base layer 150 is a silicon-germanium layer.

For obtaining a bipolar transistor with increased gain, the base layer 150 is in-situ doped so as to have an increased germanium concentration at the emitter-base junction as compared with the germanium concentration at the emitter-base junction of the adjacent medium-beta bipolar transistor. Further, the base Gummel number is reduced by compensation of the base dopant at its peak concentration with the additional implant dopant. The reduced base Gummel number likewise causes an increased gain of the bipolar device.

While the above embodiments mainly refer to NPN transistors, it should be noted that similar techniques can be used to selectively increase the gain of a PNP transistor since a higher Ge content at the emitter-base junction also leads to a higher collector current in a PNP transistor.

What is claimed is:

1. A method for fabricating a semiconductor device comprising a first bipolar device and a second bipolar device being of the same dopant type, the method comprising the steps of:
   depositing a first gate oxide dielectric layer over a semiconductor layer;
   depositing a gate conductor layer over the first gate oxide dielectric layer;
   defining base regions of the first and second bipolar devices of the same dopant type;
   removing the gate conductor layer and the first gate oxide dielectric layer in the base regions of the first and second bipolar devices;
   depositing a base layer on the gate conductor layer and on the exposed semiconductor layer the base regions of the first and second bipolar devices, both base regions part of the base layer;
   depositing a first insulating layer over the base layer;
   depositing a second insulating layer over the first insulating layer,
   patterning emitter regions through patterning a first photoresist layer, thereby defining the emitter regions of the first and second bipolar devices;
   etching the second insulating layer down to the first insulating layer;
   removing the first photoresist layer thereby forming two emitter windows, wherein each of the two emitter windows allows an implantation of a emitter of each bipolar device when not covered in a photoresist, and wherein each emitter window is over the base layer;
   patterning a second photoresist having an associated emitter window for an emitter enhancing implant on the second bipolar device, but not on the first bipolar device, thereby masking the emitter of the first bipolar device;
   exposing the base layer in the base region of the second bipolar device to the emitter enhancing implant through the associated emitter window;
   removing the second photoresist layer of the first and second bipolar devices thereby forming two emitter windows, wherein the second emitter area of the base layer is doped by the emitter enhancing implanting while the first emitter area of the base layer does not have emitter species yet;
   removing an oxide of an emitter area
   depositing a polysilicon emitter layer over the base layer of the first and second bipolar devices;
   implanting emitter species into the deposited polysilicon layer to dope the polysilicon; and
   annealing to diffuse:
     a) the second implanted emitter species in the deposited emitter polysilicon into the emitter area of the first and second bipolar device; and
     b) the first implanted emitter species from the emitter enhancing implant in the emitter area of the second bipolar device,
   wherein the annealing of the first bipolar device and the second bipolar device occur at the same time.

2. The method of claim 1, wherein said base layer is doped with boron.

3. The method of claim 1, further comprising:
   patterning a third photo resist to form an emitter polysilicon;

etching the polysilicon;
etching the second insulating layer;
removing the third photoresist;
patterning a fourth photoresist to form a base polysilicon for the first bipolar device and the second bipolar device;
etching the first insulating layer and the stack of the base deposited layer and the gate conductor layer of the first and second bipolar device; and
removing the fourth photoresist.

4. The method of claim 1, wherein the base layer is a silicon-germanium layer, wherein the additional emitter implant is such that the emitter-base junction is shifted deeper into the silicon-germanium layer.

5. The method of claim 1, wherein the additional emitter implant is made with arsenic.

6. The method of claim 1, wherein the additional emitter implant is made with phosphorus.

7. The method of claim 1, wherein the base layer is in-situ Germanium doped such that the Germanium concentration is higher at deeper into the layer, hence higher current gain in case the emitter-base junction is shifted deeper into the silicon-germanium layer.

8. The method according to claim 1, wherein the base region of the second bipolar device is in-situ doped such that the emitter-base junction is located deeper in the silicon-germanium layer than the emitter-base junction of the first bipolar device.

9. The method of claim 8, wherein said second bipolar device has a higher gain than said first bipolar device due at least to the second bipolar device is in-situ doped such that the emitter-base junction is located deeper in the silicon-germanium layer than the emitter-base junction of the first bipolar device.

10. The method according to claim 6, wherein the base region of the second bipolar device is in-situ doped so as to have a higher germanium concentration at the emitter-base junction than the base region of the first bipolar device has at its emitter-base junction.

11. The method of claim 1, the first bipolar device having a base region with a first dopant profile and the second bipolar device having a base region with a second dopant profile, and the first and second dopant profiles being different from each other.

12. The method of claim 10, wherein the second dopant profile is such that the emitter-base junction of the second bipolar device is located deeper in the silicon-germanium layer than the emitter-base junction of the first bipolar device.

13. The method of claim 10, wherein the first and second dopant profiles are such that the germanium concentration at the emitter-base junction of the second bipolar device is higher than the germanium concentration at the emitter-base junction of the first bipolar device.

14. The method of claim 1, wherein said first and second bipolar transistors are NPN transistors.

15. The method of claim 1, wherein the first insulating layer is an oxide layer and the second insulating layer is a nitride layer.

16. The method of claim 1, wherein the emitter window is larger than the defined emitter area.

17. The method of claim 1, wherein an emitter enhancing implant does not penetrate a nitride/oxide stack, but it can penetrate oxide, therefore forming the enhanced emitter only in a defined emitter area.

18. The method of claim 1, wherein the emitter species of the first implantation and the emitter species of the second implantation are a same species.

19. The method of claim 1, wherein the emitter-enhancing implant causes a different beta between the two bipolar devices.

* * * * *